(12) United States Patent
Tomokage et al.

(10) Patent No.: US 10,721,848 B2
(45) Date of Patent: Jul. 21, 2020

(54) MANUFACTURING DEVICE, MANUFACTURING MANAGEMENT SYSTEM, AND MANUFACTURING CONTROL PROGRAM

(71) Applicants: Fukuoka University, Fukuoka (JP); Zuken, Inc., Kanagawa (JP); Fuji Corporation, Aichi (JP); Hioki E. E. Corporation, Nagano (JP)

(72) Inventors: Hajime Tomokage, Fukuoka (JP); Yoshihisa Katoh, Fukuoka (JP); Hidemichi Kawase, Tokyo (JP); Hiroshi Matsuoka, Tokyo (JP); Hirohiko Matsuzawa, Kanagawa (JP); Kazuhiro Kusunoki, Aichi (JP); Hiroshi Yamazaki, Nagano (JP)

(73) Assignees: Fukuoka University, Fukuoka (JP); Zuken, Inc., Kanagawa (JP); Fuji Corporation, Aichi (JP)

( * ) Notice: Subject to any disclaimer, the term of this patent is extended or adjusted under 35 U.S.C. 154(b) by 571 days.

(21) Appl. No.: 14/836,135

(22) Filed: Aug. 26, 2015

(65) Prior Publication Data
US 2016/0192551 A1 Jun. 30, 2016

Related U.S. Application Data

(63) Continuation of application No. PCT/JP2013/054923, filed on Feb. 26, 2013.

(51) Int. Cl.
*H05K 13/04* (2006.01)
*H05K 13/08* (2006.01)
*H05K 3/30* (2006.01)

(52) U.S. Cl.
CPC .......... *H05K 13/08* (2013.01); *H05K 13/083* (2018.08); *H05K 13/084* (2018.08)

(58) Field of Classification Search
CPC .... H05K 13/08; H05K 13/02; H05K 3/30–32; H05K 13/083; H05K 13/084;
(Continued)

(56) References Cited

U.S. PATENT DOCUMENTS 6,045,653 A * 4/2000 Johnson ............... H05K 7/12
156/292
6,332,536 B2 * 12/2001 Easton ............... H05K 13/0417
206/459.5
(Continued)

FOREIGN PATENT DOCUMENTS

DE 3618570 A1 6/1987
JP 04155278 A 5/1992
(Continued)

OTHER PUBLICATIONS

European Search Report dated Sep. 23, 2016 from corresponding International Application No. PCT/JP2013/054923.
(Continued)

*Primary Examiner* — Peter Dungba Vo
*Assistant Examiner* — Kaying Kue
(74) *Attorney, Agent, or Firm* — Duquette Law Group LLC

(57) ABSTRACT

Provided is a manufacturing apparatus that manufactures a high-quality manufacturing object by using component information per unit of individual electronic component or per unit of package in a plurality of electronic components that have been packaged. The manufacturing apparatus is a manufacturing apparatus that manufactures a product by taking out each electronic component from packaged components in which a plurality of electronic components are packaged. The manufacturing apparatus is provided with: a component information reading unit that reads component information per unit of electronic component or per unit of
(Continued)

package in the packaged components; a manufacturing control unit that controls, using the read component information, the manufacturing treatment of product into which electronic components indicated in the component information are incorporated; and an incorporation information generating unit that generates incorporation information regarding a state of incorporation of each electronic component in the product.

8 Claims, 9 Drawing Sheets

(58) Field of Classification Search
CPC .......... Y10T 29/53022; Y10T 29/4913; Y10T 29/53174; Y10T 29/53004; Y10T 29/53
USPC .......... 29/739, 729, 705, 832; 174/260, 250
See application file for complete search history.

(56) References Cited

U.S. PATENT DOCUMENTS

| | | | | |
|---|---|---|---|---|
| 6,779,726 B1 * | 8/2004 | Easton | ............... | H05K 13/0084 235/462.01 |
| 6,816,751 B1 | 11/2004 | Alice et al. | | |
| 7,571,539 B2 * | 8/2009 | Maenishi | ............. | H05K 13/084 29/834 |
| 8,585,850 B2 * | 11/2013 | Muirhead | ............... | B29C 51/02 156/242 |
| 2003/0096437 A1 * | 5/2003 | Oh | .................... | G01N 21/95684 438/14 |
| 2006/0012967 A1 * | 1/2006 | Asai | ......................... | G02B 6/43 361/764 |
| 2006/0207089 A1 * | 9/2006 | Maenishi | ............. | H05K 13/084 29/832 |
| 2008/0147232 A1 * | 6/2008 | Kuribayashi | ...... | H05K 13/0895 700/160 |
| 2011/0302776 A1 | 12/2011 | Kato et al. | | |

FOREIGN PATENT DOCUMENTS

| | | |
|---|---|---|
| JP | 2002257891 A | 9/2002 |
| JP | 2003283199 A | 10/2003 |
| JP | 2005136023 A | 5/2005 |
| JP | 2008166637 A | 7/2008 |
| JP | 2009044197 A | 2/2009 |
| JP | 2010080613 A | 4/2010 |

OTHER PUBLICATIONS

International Search Report dated Apr. 23, 2013 from corresponding International Application No. PCT/JP2013/054923.

* cited by examiner

MANUFACTURING DEVICE, MANUFACTURING MANAGEMENT SYSTEM, AND MANUFACTURING CONTROL PROGRAM

RELATED APPLICATIONS

This patent application is a continuation of and claims the benefit of PCT International Application No. PCT/JP2013/054923, filed on Feb. 26, 2013, entitled, "Manufacturing Device, Manufacturing Management System, and Manufacturing Control Program," the contents and teachings of which are hereby incorporated by reference in their entirety.

TECHNICAL FIELD

The present invention relates to a manufacturing apparatus that performs a manufacturing treatment using individual component information regarding packaged electronic components that are incorporated into a manufacturing object, and the like.

BACKGROUND

For example, when mounting electronic components on a printed board, it has been common practice to perform the mounting by taking out individual electronic components from a tray on which the electronic components have been packaged. In addition, it has been also common practice to set a reel in which a plurality of electronic components are successively arranged and packaged, and to mount the electronic components on the board while sequentially taking out the electronic components from the reel that is rotating. A technique shown in Patent Literature (PTL) 1 is disclosed as the related art, for example.

The technique shown in Patent Literature 1 is a reel component management system in which, when loading slots of a mounter with reel components to which IC tags were attached, information in the IC tags is read using a portable reader-writer device, and the read information in the IC tags is displayed on a display unit of the portable reader-writer device. In the reel component management system, storage location information of the reel components to which IC tags were attached, was written in advance in the IC tags. When taking out the reel components from the mounter after a mounting process for the reel components by the mounter has been completed, the storage location information of the IC tags attached to the reel components is read with the portable reader-writer device and displayed on the display unit.

CITATION LIST

Patent Literature

PTL 1: Japanese Patent Application Laid-Open No. 2010-80613.

SUMMARY

Technical Problem

However, the technique shown in Patent Literature 1 can prevent mismounting of components during the mounting process and can efficiently manage a recall of the reel after the mounting process, but does not intend to improve quality of product after the mounting depending on individual components to be mounted or a state of package.

The present invention provides a manufacturing apparatus that manufactures a high-quality manufacturing object by using component information per unit of individual electronic component or per unit of package in a plurality of electronic components that have been packaged.

Solution to Problem

A manufacturing apparatus according to the present invention is a manufacturing apparatus that manufactures a manufacturing object by taking out each electronic component from packaged components in which a plurality of electronic components have been packaged, the manufacturing apparatus being provided with: a component information reading unit that reads, from a component information storage unit in which component information per unit of electronic component or per unit of package in the packaged components is stored, the component information; and a manufacturing control unit that controls, using the read component information, a manufacturing treatment of a manufacturing object into which electronic components indicated in the read component information are incorporated.

Thus, in the manufacturing apparatus according to the present invention, by using component information per unit of electronic component or per unit of package in the packaged components to control a manufacturing treatment of a manufacturing object into which electronic components indicated in the component information are incorporated, it is possible to perform the manufacturing treatment in the light of characteristics of the individual electronic components (such as, for example, a state of the surface of the component, the center of gravity, a value of resistance, a value of capacitance, and a displacement of the package) or characteristics per unit of package (such as, for example, a quality of material, a size, a shape, and a depth of a reel or a tray that packages the components), thereby bringing about effects of making it possible to manufacture a high-quality product and realize a manufacturing process with a small reduction in yield rate.

The manufacturing apparatus according to the present invention may be provided with: an incorporation information generating unit that generates incorporation information regarding a state of incorporation of said each electronic component in the manufacturing object that has been manufactured by the manufacturing control unit; and an incorporation information outputting unit that outputs the generated incorporation information.

Thus, in the manufacturing apparatus according to the present invention, by generating incorporation information regarding a state of incorporation of each electronic component in the manufacturing object and outputting that incorporation information, it brings about effects of making it possible to manufacture a high-quality product using the incorporation information. For example, it is made possible to perform an accurate test with a value close to an actual measured value where electronic components are actually mounted, or to perform tracking of products when there are defects in electronic components.

A manufacturing management system according to the present invention is a manufacturing management system that is provided with: the manufacturing apparatus; and a verification apparatus that verifies the manufacturing object using the incorporation information outputted from the manufacturing apparatus, wherein the verification apparatus is provided with: an incorporation information reading unit that reads the incorporation information; an operation control unit that controls an operation of the manufacturing object; a test unit that tests whether the operation of the manufacturing object is proper or not, based on the read incorporation information; and a test result outputting unit that outputs a result of the test as a test result.

Thus, in the manufacturing management system according to the present invention, it is provided with the manufacturing apparatus and a verification apparatus that verifies the manufacturing object using the incorporation information, and it is configured to control an operation of the manufacturing object, test whether the operation of the manufacturing object is proper or not, based on the read incorporation information, and output a result of the test as a test result, therefore bringing about effects of making it possible to perform more accurate verification based on an incorporation state of each electronic component that has been actually mounted.

The manufacturing management system according to the present invention may be configured such that the manufacturing apparatus is a chip mounter that arranges the electronic components on a board, and the verification apparatus is a tester; and the test unit not only tests whether the operation of the manufacturing object is proper or not but also tests by determining which is a cause of a defect among the manufacturing apparatus, the electronic components, and the board.

Thus, in the manufacturing management system according to the present invention, the manufacturing apparatus is a chip mounter that arranges the electronic components on a board, the verification apparatus is a tester, and the test unit not only tests whether the operation of the manufacturing object is proper or not but also tests by determining which is a cause of a defect among the manufacturing apparatus, the electronic components, and the board, therefore bringing about effects of making it possible to perform a defect analysis efficiently.

A manufacturing management system according to the present invention is a manufacturing management system that is provided with: the manufacturing apparatus; and a verification apparatus that verifies the manufacturing object using the incorporation information outputted from the manufacturing apparatus, wherein the verification apparatus is provided with: an incorporation information reading unit that reads the incorporation information; a design information reading unit that reads, from a design information storage unit that stores design information of the manufacturing object, the design information; and an adjustment unit that performs an adjustment by correcting an operation of the manufacturing object based on the read incorporation information and the read design information.

Thus, in the manufacturing management system according to the present invention, it is provided with the manufacturing apparatus and a verification apparatus that verifies the manufacturing object using the incorporation information, and it is configured to perform an adjustment by correcting an operation of the manufacturing object based on the read incorporation information and the read design information such that the manufacturing object having components mounted performs accurate operations in accordance with the design information, thereby bringing about effects of making it possible to manufacture a high-quality product with no reduction in yield rate.

A manufacturing management system according to the present invention is a manufacturing management system that is provided with: the manufacturing apparatus and a verification apparatus that verifies the manufacturing object using the incorporation information outputted from the manufacturing apparatus, wherein the verification apparatus is provided with: an incorporation information reading unit that reads the incorporation information; and a detection unit that detects a manufacturing object into which a predetermined electronic component has been incorporated, based on the incorporation information.

Thus, in the manufacturing management system according to the present invention, it is provided with the manufacturing apparatus and a verification apparatus that verifies the manufacturing object using the incorporation information, and it is configured to detect a manufacturing object into which a predetermined electronic component has been incorporated, based on the read incorporation information, therefore bringing about effects of making it possible to, even when there is a defect in an electronic component, for example, easily identify a manufacturing object in which that electronic component has been used, and recall the same.

DETAILED DESCRIPTION

Figure 1:
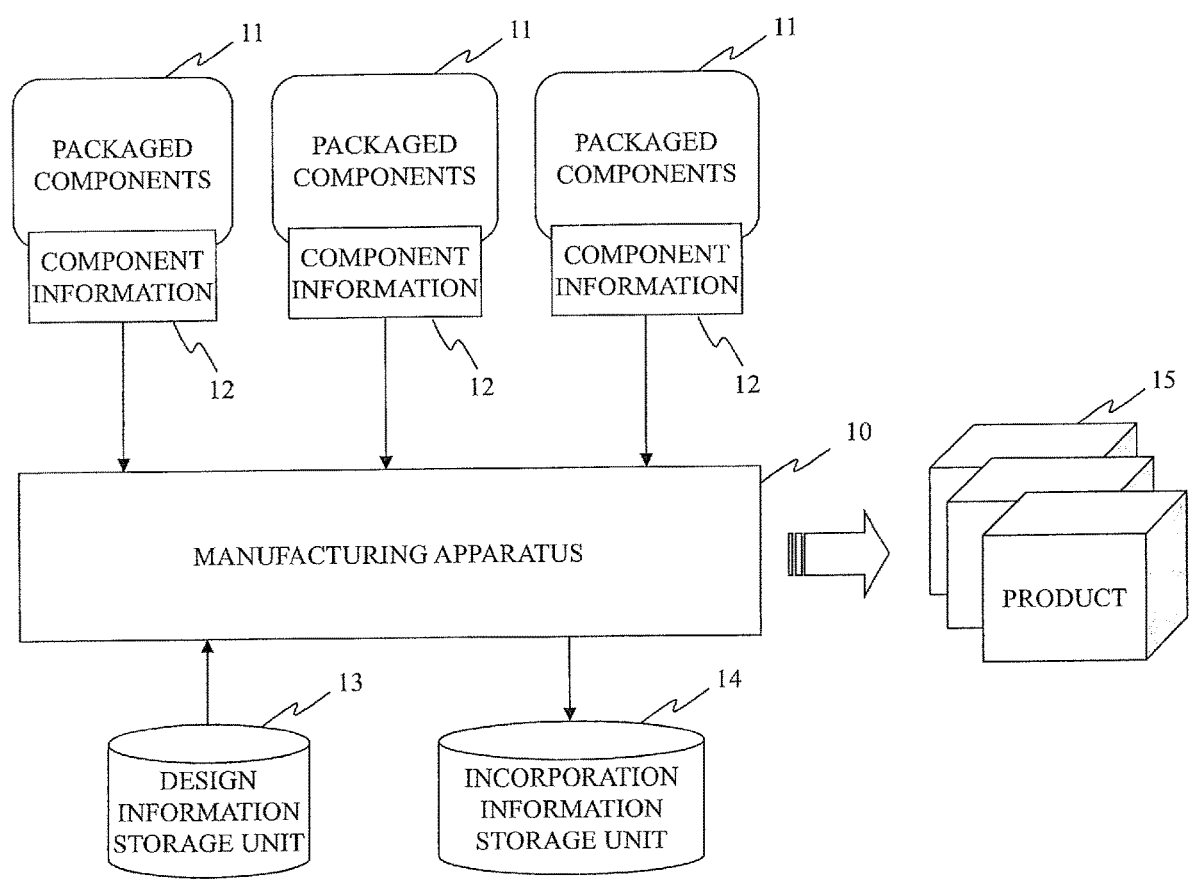
FIG. 1 is a system configuration diagram using a manufacturing apparatus according to the first embodiment.

Embodiments of the present invention will be described below. The same reference numerals are given to the same elements throughout the present embodiments.

First Embodiment of the Present Invention

Figure 2:
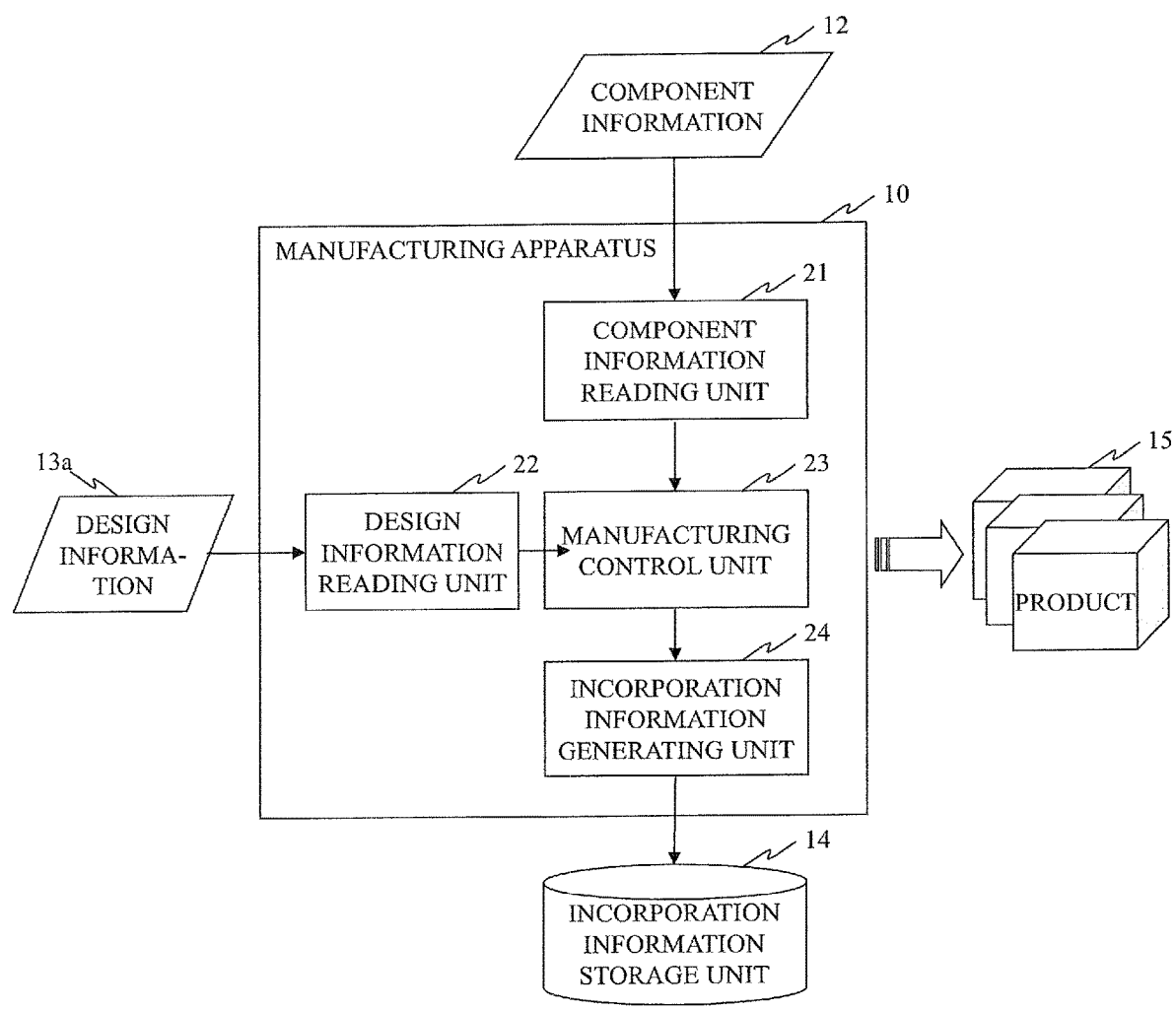
FIG. 2 is a functional block diagram of the manufacturing apparatus according to the first embodiment.
Figure 3:
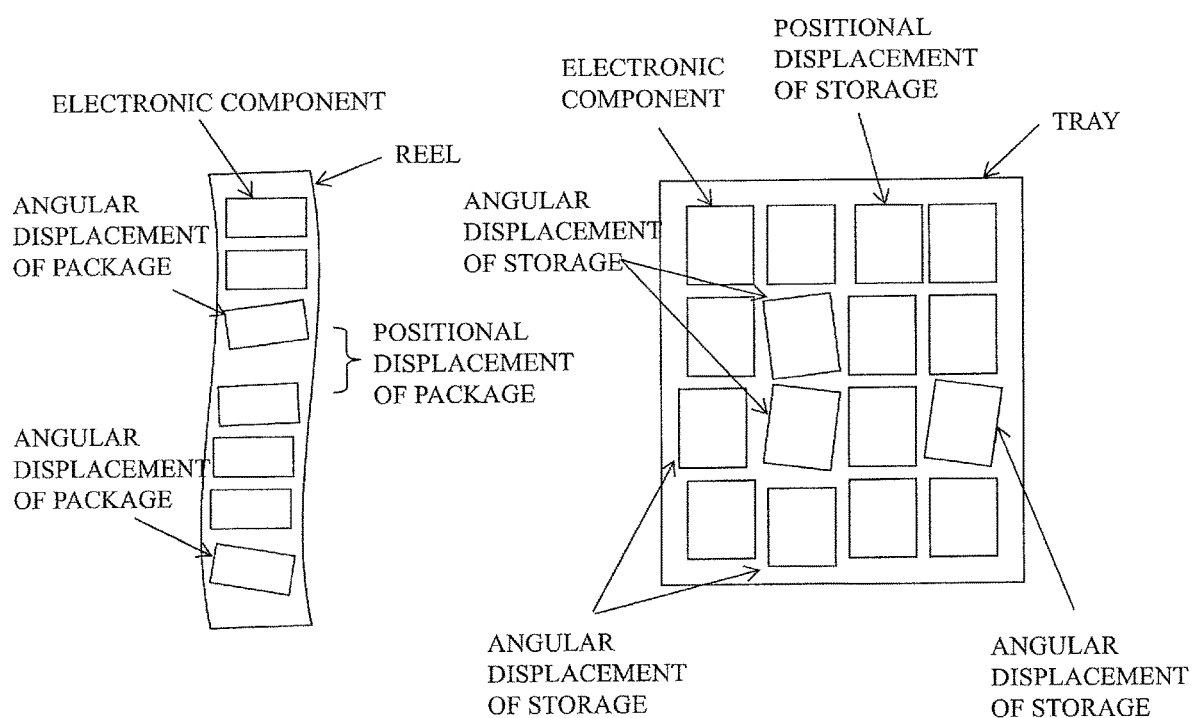
FIG. 3 is a diagram showing an example of a state of package of electronic components.
Figure 4:
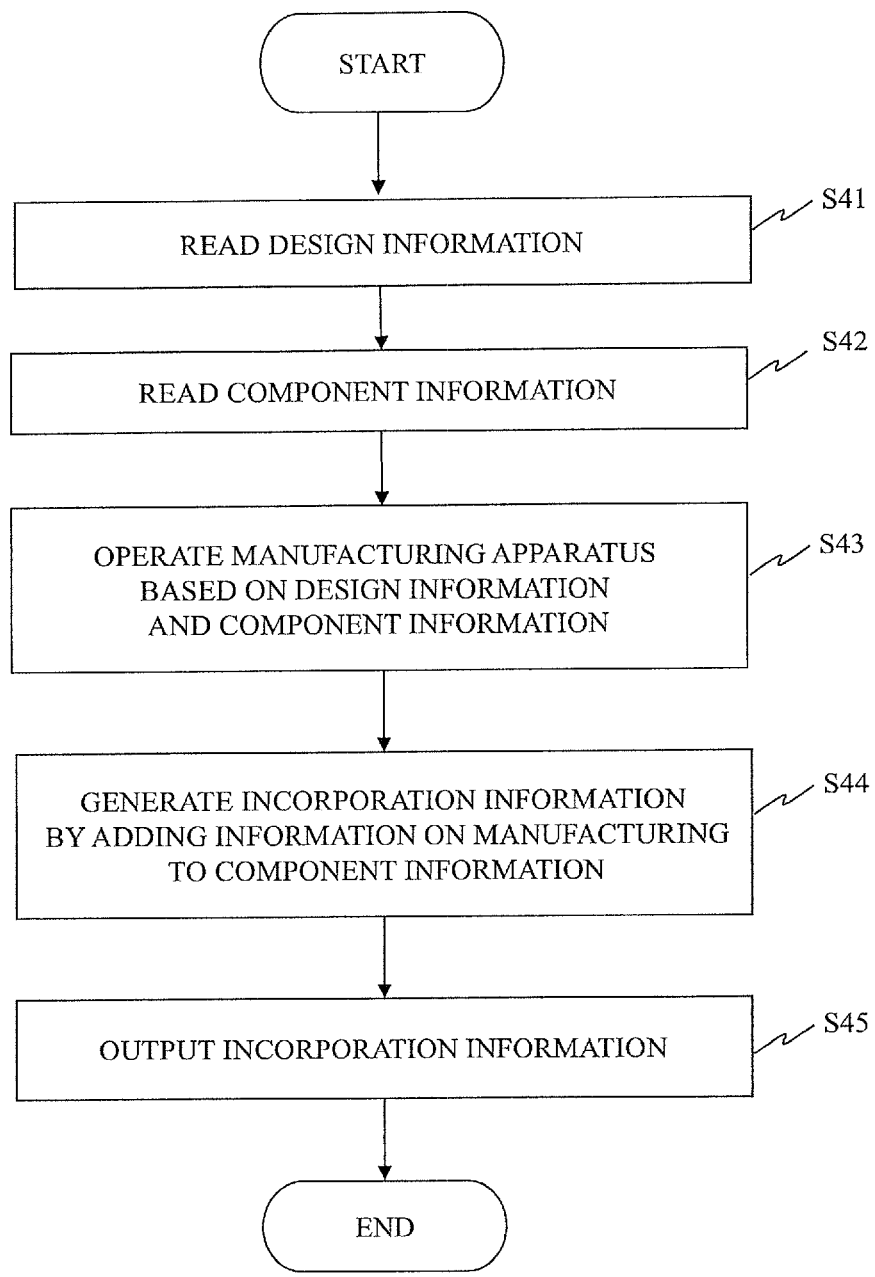
FIG. 4 is a flowchart showing an operation of the manufacturing apparatus according to the first embodiment.

A manufacturing apparatus according to the present embodiment and a manufacturing management system using the manufacturing apparatus will be described with reference to FIG. 1 to FIG. 4. FIG. 1 is a system configuration diagram using the manufacturing apparatus according to the present embodiment; FIG. 2 is a functional block diagram of the manufacturing apparatus according to the present embodiment; FIG. 3 is a diagram showing an example of a state of package of electronic components; and FIG. 4 is a flowchart showing an operation of the manufacturing apparatus according to the present embodiment.

In FIG. 1, the manufacturing apparatus according to the present embodiment reads component information 12 that stores information regarding packaged components 11 in which a plurality of electronic components have been packaged, and manufactures a product 15 using the read component information 12. The packaged components 11 comprise a plurality of electronic components that are wound on a reel and packaged, or a plurality of electronic components that are fitted into respective cavities of a tray on which grid-like cavities are formed, for example. The component information 12 stores information per unit of electronic component (individual information of each one of components) or information per unit of package (information for each packaged reel or information for each packaged tray) about electronic components that have been actually packaged.

Specific examples of the information per unit of electronic component include, for example, a three-dimensional shape of a component, a friction coefficient of a component surface, a color, a quality of material, the center of gravity of a component, a mark position, and characteristic values (such as, for example, a value of resistance, a value of capacitance, and a thermal property). That is, the component information 12 includes detailed information containing an error of an individual component even if the components are the same in type. Additional information such as, for example, the name of component, the model number, an average value, a maximum value, and a minimum value of the characteristic values in each component per package, and an average value, a maximum value, and a minimum value of the mark position, may be included.

Specific examples of the information per unit of package include, for example, a shape and a quality of material of a reel or a tray, and a depth of the tray. That is, the component information 12 includes detailed information containing an error per unit of individual reel or tray even if the reels or trays are the same.

Incidentally, the component information 12 may be provided in a state where it is stored in a memory or an IC chip, or may be provided in a state where it is recorded as coded information (such as, for example, QR Code™). It may be preferable that these information is provided in an encrypted state and is decrypted when used in a manufacturing apparatus 10.

The manufacturing apparatus 10 reads, from a design information storage unit 13, design information regarding the product 15 created by a design apparatus such as CAD and performs the manufacturing treatment of the product 15 in accordance with the design information. At this time, the manufacturing apparatus 10 incorporates the components into the product 115 while reading and referring to the component information 12 provided with the packaged components. In the past, the manufacturing has taken place based on information for each type of component (such as, for example, publicly-available catalog values that have been released by component manufacturers). However, since there is an error for each component even if components are the same in type, the error may cause manufacturing errors to occur or yield rate to lower. In the present embodiment, by reading the component information 12, it is possible to perform the manufacturing treatment in the light of the error for each component, thereby making it possible to manufacture a high-quality product 15 and prevent a reduction in yield rate.

The manufacturing apparatus 10 incorporates each component of the packaged components 11 into the product 15, and generates incorporation information by writing a state of that incorporation in the component information 12. The generated incorporation information is stored in an incorporation storage unit 14. Information indicating the state of the incorporation includes a position, a direction, and an angle in which the components were actually arranged, for example. It can also include identification information per reel or tray on which incorporated components were packaged, and identification information per individual electronic component, for example. The incorporation storage unit 14 can be used for a subsequent treatment of the manufacturing process, whose utilization form will be described later in detail.

Next, the configuration of the manufacturing apparatus 10 according to the present embodiment will be described. In FIG. 2, the manufacturing apparatus 10 is provided with: a component information reading unit 21 that reads the component information 12; a first design information reading unit 22 that reads design information 13a stored in the design information storage unit 13; a manufacturing control unit 23 that performs a manufacturing treatment of the product 15 using at least the read design information 13a and the read component information 12; and an incorporation information generating unit 24 that generates incorporation information indicating a state of incorporation of each electronic component that has been incorporated into the product 15 and stores the generated incorporation information in the incorporation information storage unit 14.

The manufacturing control unit 23 refers to the read component information 12 when incorporating the components based on the design information 13a. Then, the manufacturing control unit 23 controls the manufacturing treatment based on the component information 12. For example, even when there is an error in a state of storage for each component stored in the reel or the tray as shown in FIG. 3, it is possible to incorporate the components with a high degree of accuracy by controlling the manufacturing apparatus based on those information.

Incidentally, the incorporation information may be stored in the incorporation information storage unit 14 of other manufacturing apparatus 10 (for example, a manufacturing apparatus for use at a later stage of the manufacturing process), or may be outputted in a visible state where the manufacturer can easily look at (for example, displayed on a display or printed on a paper).

Next, the operation of the manufacturing apparatus 10 according to the present embodiment will be described. In FIG. 4, at first, the first design information reading unit 22 reads the design information 13a (S41), and the component information reading unit 21 reads the component information 12 (S42). As described above, the design information 13a is created by the design apparatus such as CAD, and the component information 12 is information per unit of electronic component or information per unit of package about electronic components that have been packaged. The manufacturing control unit 23 operates the manufacturing apparatus 10 based on the design information 13a and the component information 12 (S43). In this case, it is made possible to manufacture high-quality products by finely controlling the operation of the manufacturing apparatus 10 per unit of component or per unit of package.

The incorporation information generating unit 24 generates the incorporation information by adding, to the component information 12, a state of electronic components that have been incorporated by the manufacturing control unit 23 (S44), and outputs the generated incorporation information (S45). This incorporation information may be stored in the incorporation information storage unit 14, or may be outputted on a display or a paper, or may be passed to an apparatus for use in a subsequent treatment. As described above, the incorporation information includes information such as a position, a direction, and an angle in which the components were actually arranged, and can be used for the subsequent treatment (such as, for example, a defect analysis, an operation verification, an adjustment of characteristic values) of the manufacturing process described below.

Incidentally, in the present embodiment, by utilizing identification information of individual electronic components or identification information of a reel or tray that is a unit of package, it is made possible to easily recall a product that contains a defective electronic component when a defect of individual electronic component or a defect of electronic component per unit of package has been found. That is, it is possible to identify and recall a product 15 that contains a defective electronic component, by reading the generated incorporation information and searching with identification information of defective electronic components or identification information of a reel or tray on which detective electronic components were packaged. In this case, identification information of individual products 15 is associated with the identification information of individual electronic components incorporated into the products 15, the reel, and the tray, and those items of identification information are stored in the incorporation information storage unit 14 in a state of that association.

Further, each of the above configuration and operation is realized by CPU's reading and executing the program stored in a memory such as a ROM or a RAM. The manufacturing apparatus 10 may store data in a mass-storage device such as a hard disk or a flash memory as needed. Furthermore, the manufacturing apparatus 10 may be configured with an input-output interface for inputting, for example, operation information from the manufacturer and outputting information, as well as a communication interface for communicating with external devices.

Second Embodiment of the Present Invention

Figure 5:
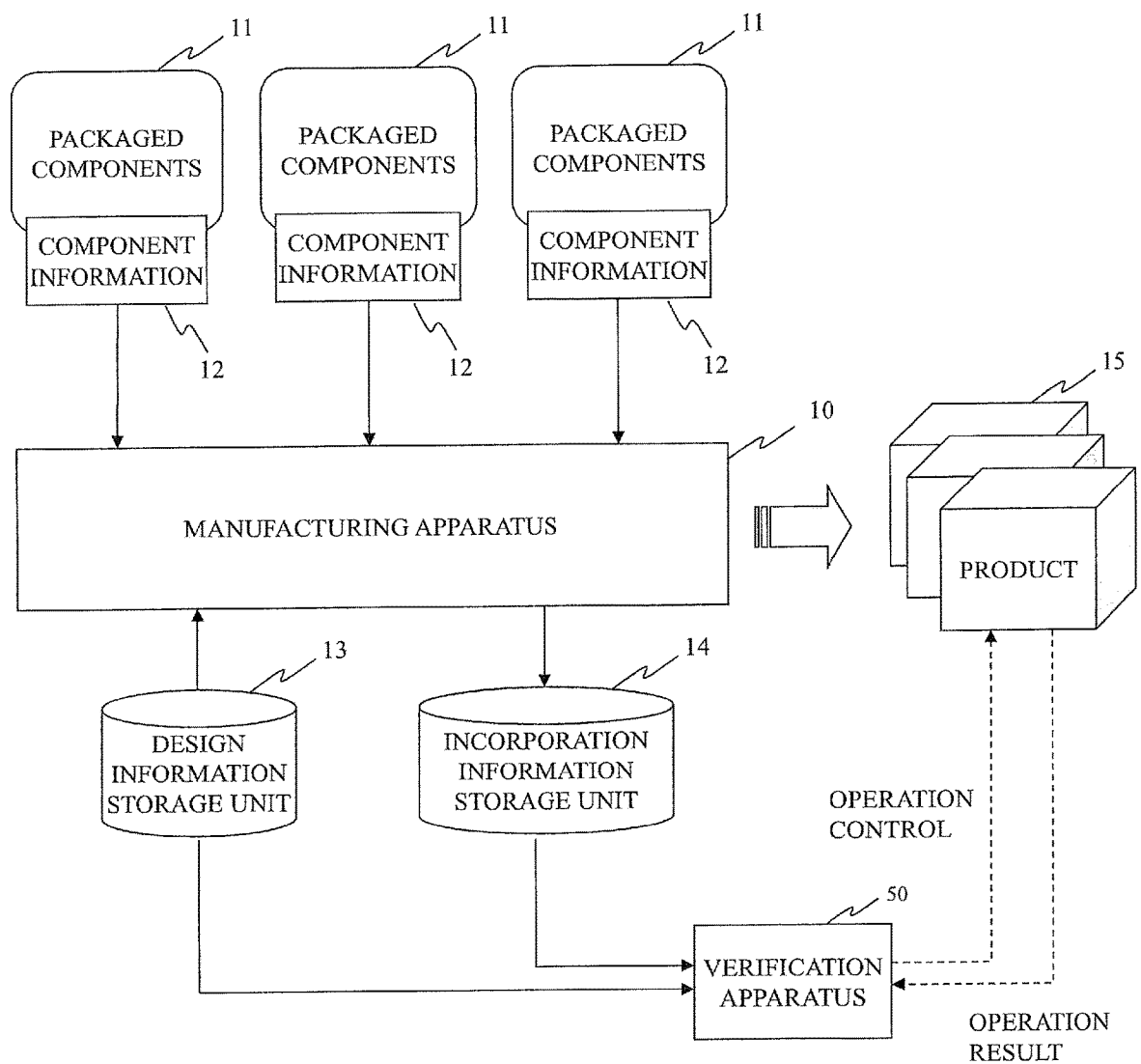
FIG. 5 is a system configuration diagram using a manufacturing apparatus according to the second embodiment.
Figure 6:
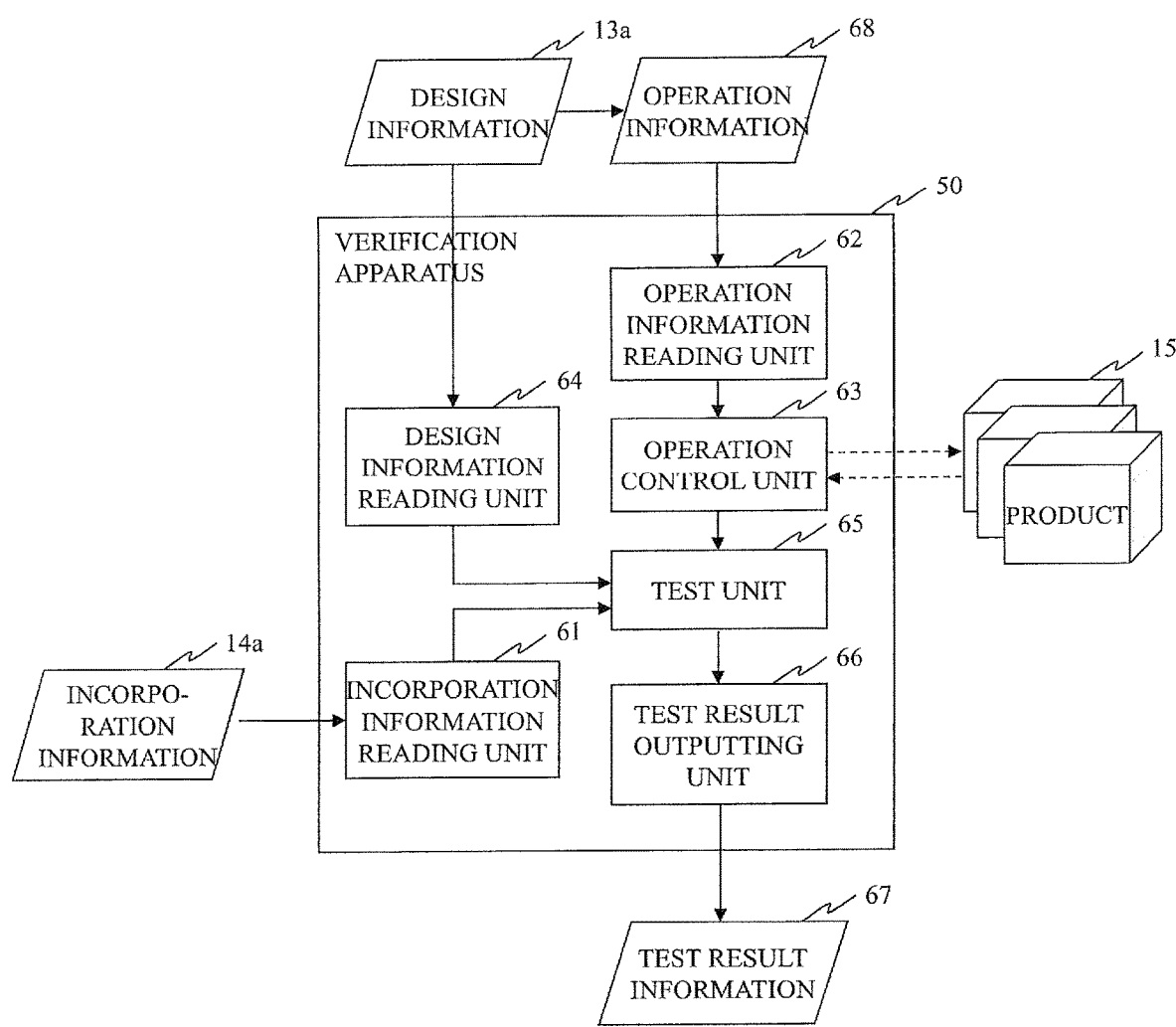
FIG. 6 is a functional block diagram of a verification apparatus used in a manufacturing management system according to the second embodiment.
Figure 7:
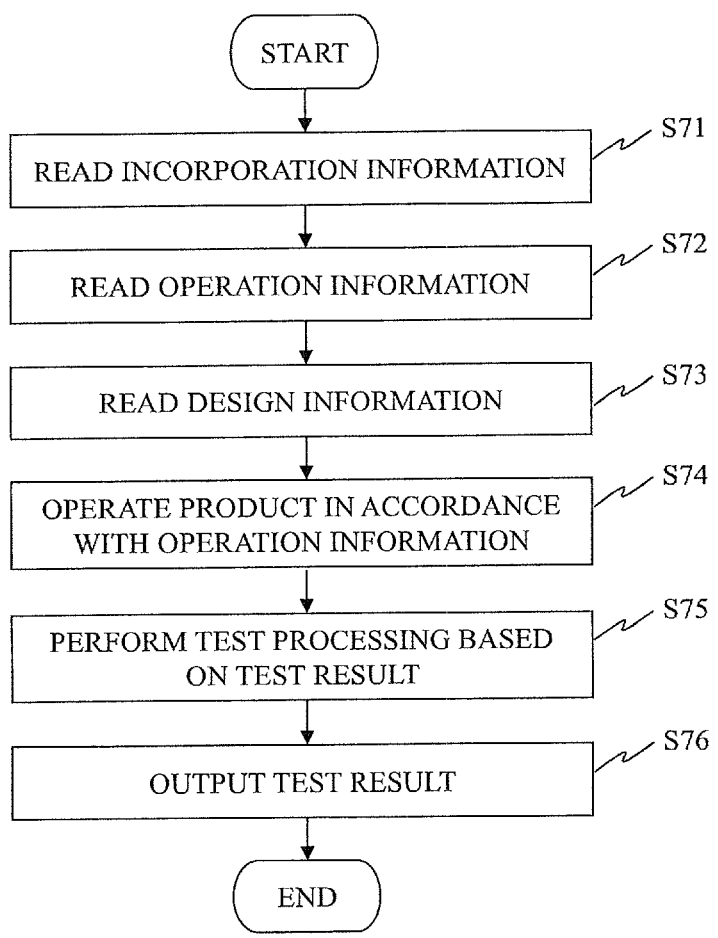
FIG. 7 is a flowchart showing an operation of the verification apparatus according to the second embodiment.

A manufacturing apparatus according to the first embodiment and a manufacturing management system using the manufacturing apparatus will be described with reference to FIG. 5 to FIG. 7. FIG. 5 is a system configuration diagram using the manufacturing apparatus according to the present embodiment; FIG. 6 is a functional block diagram of a verification apparatus used in the manufacturing management system according to the present embodiment; FIG. 7 is a flowchart showing an operation of the verification apparatus according to the present embodiment.

Incidentally, in the present embodiment, an explanation that overlaps with the first embodiment will be omitted.

As shown in FIG. 5, the present embodiment provides a verification apparatus 50 that verifies the product 15, as an apparatus for performing the subsequent treatment of the manufacturing process. The verification apparatus 50 performs an operation check of the product 15 manufactured by the manufacturing apparatus 10 and determines whether the product 15 is proper or not as a product. That is, the verification apparatus 50 controls the operation of the product 15 in accordance with information fir the operation check and Obtains its operation result. Based on the obtained operation result, it is determined proper or not as a product. In this case, the operation check is performed by using the incorporation information generated by the manufacturing apparatus 10 in the first embodiment. By performing the operation check using the incorporation information, it is possible to test according to a state in which the electronic components have been incorporated and improve verification accuracy.

The configuration of the verification apparatus 50 will be described. In FIG. 6, the verification apparatus 50 is provided with: an incorporation information reading unit 61 that reads incorporation information 14a stored in the incorporation information storage unit 14; an operation information reading unit 62 that reads operation information 68 created based on the design information 13a stored in the design information storage unit 13; an operation control unit 63 that controls the operation of the product 15 in accordance with the read operation information 67; a design information reading unit 64 that reads the design information 13a; a test unit 65 that tests whether the product 15 is proper or not as a product, based on a result of the operation control by the operation control unit 63 as well as the read design information 13a and the read incorporation information 14a; and a test result outputting unit 66 that outputs a result of the test by the test unit 65 as test result information 67.

Incidentally, the operation information 68 may be generated by converting the design information 13a stored in the design information storage unit 13 in accordance with predetermined rule information, or may be created by the person in charge based on the design information 13a. When the operation information 68 is generated by converting the design information 13a, the design information storing unit 13 may comprise in advance a database having the structure in which the design information 13a can be converted to the operation information 68, and generate operation information 68 suitable for the verification apparatus 50 using the rule information managed by the administrator.

The test unit 65 refers to information of the incorporation information 14a and obtains information on electronic components that have been actually incorporated into product 15 when the product 15 was operated and showed different operation from the operation according to the design information 13a. For example, when product 15 should have shown a resistance value of 10Ω on design but has actually shown a resistance value of 8Ω, the test unit 65 refers to the incorporation information 14a and obtains component information on the components that have been actually incorporated. If that component information shows 8Ω, it is determined that the components themselves operate without problem although the product 15 does not operate accurately on design. The incorporation information 14a includes information such as a position, a direction, and an angle in which electronic components were actually arranged. The test unit 65 tests whether those information matches the design information 13a. If those information matches the design information 13a in consideration of an error, it can be determined that the electronic components were arranged without problem, and it is determined that the manufacturing apparatus 10 itself is operating normally.

Further, the test unit 65 can identify individual electronic components that do not operate accurately on design as well as identify reels or trays, by referring to the incorporation information 14a. That is, when multiple defects were detected for the components that were packaged on the same reel or tray, it can be determined that the entire electronic components that were packaged on that reel or tray are defective, and, as described above, it is possible to easily recall the product 15 into which those electronic components have been incorporated.

Incidentally, for example, when the manufacturing apparatus 10 is a mounter that mounts electronic components on a board and the verification apparatus 50 is a tester that tests the operation of the product 15, and when a defect was detected as a test result although the electronic components themselves operate without problem as described above and the mounter, which is the manufacturing apparatus 10, is determined to be operating normally, it is inevitably determined that the board is defective. That is, it is made possible to identify a defect.

Then, the operation of the verification apparatus according to the present embodiment will be described. In FIG. 7, at first, the incorporation information reading unit 61 reads the incorporation information 14a (S71). The operation information reading unit 62 reads the operation information 68 created based on the design information (S72). The design information reading unit 64 reads the design information 13a (S73). The operation control unit 63 operates the product 15 in accordance with the operation information 68 (S74). The test unit 65 performs the test processing as described above, based on the operation result of the product 15 (S75). Specifically, the test unit 65 performs the comparison of the operation result with the incorporation information 14a, the comparison of the operation result with the design information 13a, the determination of whether the operation result is proper or not based on the incorporation information 14a and the design information 13a, the identification of a defect, and the like. The test result outputting unit 65 outputs a result of the test as test result information 66 (S76), and then the processing ends.

Thus, in the manufacturing management system according to the present embodiment, it is configured to control the operation of the manufacturing object that has been manufactured, test whether the operation of the manufacturing object is proper or not based on the read incorporation information, and output a result of the test as a test result, therefore bringing about effects of making it possible to perform more accurate verification based on an incorporation state of each electronic component that has been actually mounted.

Moreover, since it is possible to test by determining which is a cause of a defect among the manufacturing apparatus, the electronic components, and the board, it is possible to perform a defect analysis efficiently.

Third Embodiment of the Present Invention

Figure 8:
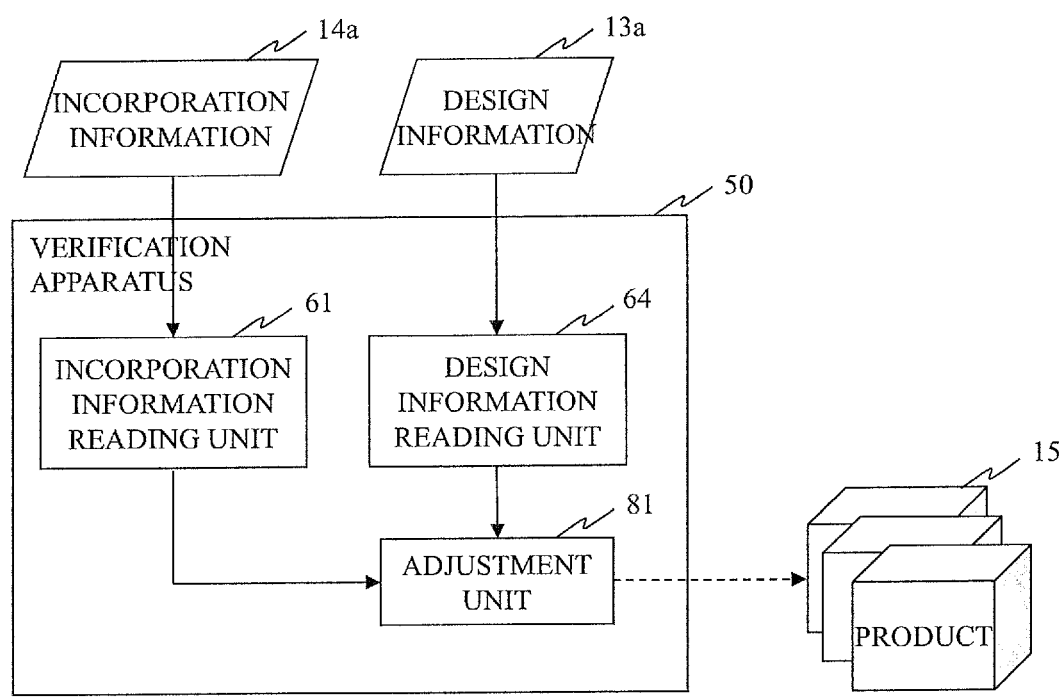
FIG. 8 is a functional block diagram of a verification apparatus used in a manufacturing management system according to the third embodiment.
Figure 9:
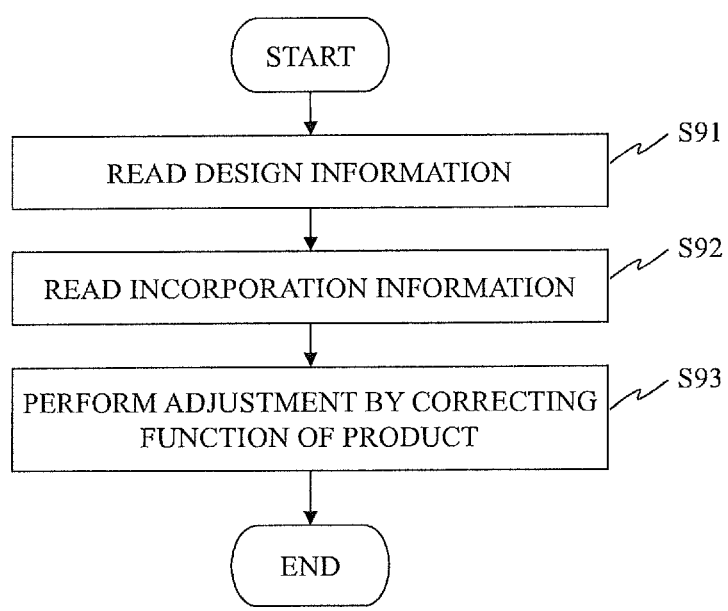
FIG. 9 is a flowchart showing an operation of the verification apparatus according to the third embodiment.

A manufacturing apparatus according to the first embodiment and a manufacturing management system using the manufacturing apparatus will be described with reference to FIGS. 8 and 9. FIG. 8 is a functional block diagram of a verification apparatus used in the manufacturing management system according to the present embodiment; and FIG. 9 is a flowchart showing an operation of the verification apparatus according to the present embodiment.

Incidentally, in the present embodiment, an explanation that overlaps with each of the above embodiments will be omitted.

As is the case with the manufacturing management system according to the second embodiment, the manufacturing management system according to the present embodiment provides a verification apparatus 50 that verifies the product 15, as an apparatus for performing the subsequent treatment of the manufacturing process. In the present embodiment, the verification apparatus 50 performs an adjustment by correcting the operation of the manufacturing object. That is, when specified by the incorporation information 14a that an incorporated electronic component is defective or shows an improper numerical value, the verification apparatus 50 performs an adjustment by compensating for an abnormal operation caused thereby such that the manufacturing object operates normally. For example, if there is a difference between the resistance value on design and the resistance value of the component that has been actually mounted, the verification apparatus 50 performs the adjustment of the resistance value so as to compensate for the difference.

The configuration of the verification apparatus 50 will be described. In FIG. 8, the verification apparatus 50 is provided with: an incorporation information reading unit 61 that reads the incorporation information 14a stored in the incorporation information storage unit 14; a design information reading unit 64 that reads the design information 13a stored in the design information storage unit 13; and an adjustment unit 81 that performs an adjustment such that the operation of the manufacturing object matches the design information 13a, based on the read incorporation information 14a and the read design information 13a.

The adjustment unit 81 performs an adjustment based on a difference between the incorporation information 14a and the design information 13a so as to compensate for the difference. Incidentally, the adjustment unit 81 may determine whether the difference between the incorporation information 14a and the design information 13a is within the acceptable error range or not, and perform no adjustment if the difference is within the acceptable range, or perform an adjustment so as to be a product within the acceptable range if the difference is out of the acceptable range.

Further, the adjustment unit 81 may adjust the operation of the product 15 based on the component information of the electronic components included in the incorporation information 14a as described above, or adjust based on the test result of the test unit 65 as shown in the second embodiment. In this case, the adjustment unit 81 would be added to the configuration of FIG. 6 in the second embodiment, and the adjustment unit 81 is configured to perform an adjustment to the product 15 by obtaining information from the test unit 65.

Then, the operation of the verification apparatus according to the present embodiment will be described. At first, the design information reading unit 64 reads the design information 13a (S91). The incorporation information reading unit 61 reads the incorporation information 14a (S92). The adjustment unit 81 adjusts, based on the design information 13a and the incorporation information 14a, the product 15 so as to compensate for the difference between the incorporation information 14a and the design information 13a (S93), and then the processing ends. As specific examples of the processing of the adjustment unit 81, it is made possible to compensate for the difference by changing the resistance value of a variable resistor component, or compensate for the difference by adjusting the value of a MEMS controller, for example.

Thus, in the manufacturing management system according to the present embodiment, since it is configured to perform an adjustment by correcting an operation of the manufacturing object based on the read incorporation information and the read design information such that the manufacturing object having components mounted performs accurate operations in accordance with the design information, it is possible to manufacture a high-quality product with no reduction in yield rate.

Incidentally, since the manufacturing management system according to the present invention performs the manufacturing management while using the design information 13a (with respect to electronic components, commonly published information such as catalog information about their characteristics) as well as the component information 12 and the incorporation information 14a indicating a state in which electronic components have been incorporated, in association therewith, it is made possible to arrange the electronic components in consideration of the actual characteristic values. That is, if the margin for characteristics of the electronic components is described in the design information 13a, it is possible to reduce defect rate and improve performance by selecting electronic components (packaged components 11) which are tailored to the margin. Further, it is possible to arrange resistors of the same resistance value at the manufacturing apparatus side by using a differential circuit, for example, and make a difference in the manufacturing apparatus.

REFERENCE SIGNS LIST

10 Manufacturing apparatus
11 Packaged components
12 Component information
13 Design information storage unit
13a Design information
14 Incorporation information storage unit
14a Incorporation information
15 Product
21 Component information reading unit
22 Design information reading unit
23 Manufacturing control unit
24 Incorporation information generating unit
50 Verification apparatus
61 Incorporation information reading unit
62 Operation information reading unit
63 Operation control unit
64 Design information reading unit
65 Test unit
66 Test result outputting unit
67 Test result information
68 Operation information
81 Adjustment unit

What is claimed is:

1. A mounter that takes out each individual electronic component from packaged components in which a plurality of electronic components have been packaged and mounts the taken-out each individual electronic component on a board, the mounter having a memory, a CPU, and an interface and comprising:
a design information reading unit incorporated in the CPU that reads design information;
a component information reading unit incorporated in the CPU that reads individual component information from a component information storage unit in which component information on characteristics of individual electronic components in the packaged components, including information to be used at least when the mounter incorporates said each individual electronic component from the packaged components, is stored, the characteristics of the individual electronic components comprising detailed information containing an error of an electronic component per unit of package even if the individual electronic components are the same in type, the component information; and
a manufacturing control unit incorporated in the CPU that controls, using the read individual component information and the read design information received from the component information reading unit and the design information reading unit incorporated in the CPU, a manufacturing treatment of a manufacturing object into which the individual electronic components indicated in the read component information are incorporated.

2. The mounter according to claim 1, further comprising:
an incorporation information generating unit incorporated in the CPU that generates incorporation information regarding a state of incorporation of said each individual electronic component in the manufacturing object that has been manufactured by the manufacturing control unit and that outputs the generated incorporation information.

3. The mounter according to claim 1, wherein the component information further includes characteristics per unit of package in the packaged components, the characteristics per unit of package comprising detailed information containing an error per unit of individual package even if the packages are the same.

4. A manufacturing management system comprising:
a mounter that takes out each individual electronic component from packaged components in which a plurality of electronic components have been packaged and mounts the taken-out each individual electronic component on a board, wherein the mounter has a memory, a CPU, and an interface and comprises:
a design information reading unit incorporated in the CPU that reads design information;
a component information reading unit incorporated in the CPU that reads individual component information from a component information storage unit in which component information on characteristics of individual electronic components in the packaged components, including information to be used at least when the mounter incorporates said each individual electronic component from the packaged components, is stored, the characteristics of the individual electronic components comprising detailed information containing an error of an electronic component per unit of package even if the individual electronic components are the same in type, the component information;
a manufacturing control unit incorporated in the CPU that controls, using the read individual component information and the read design information received from the component information reading unit and the design information reading unit incorporated in the CPU, a manufacturing treatment of a manufacturing object into which the individual electronic components indicated in the read component information are incorporated, and
an incorporation information generating unit incorporated in the CPU that generates incorporation information regarding a state of incorporation of said each individual electronic component in the manufacturing object that has been manufactured by the manufacturing control unit and that outputs the generated incorporation information; and
a verification apparatus that verifies the manufacturing object using the incorporation information outputted from the mounter.

5. The manufacturing management system of claim 4, wherein the verification apparatus has a verification apparatus CPU and comprises:
an incorporation information reading unit of the verification apparatus CPU that reads the incorporation information;
an operation control unit of the verification apparatus CPU that controls an operation of the manufacturing object;

a test unit of the verification apparatus CPU that tests whether the operation of the manufacturing object is proper or not, based on the read incorporation information; and a test result outputting unit of the verification apparatus CPU that outputs a result of the test as a test result.

6. The manufacturing management system according to claim 5, wherein:

the mounter is a chip mounter that arranges the individual electronic components on a board, and the verification apparatus is a tester; and the test unit of the verification apparatus CPU not only tests whether the operation of the manufacturing object is proper or not but also tests by determining which is a cause of a defect among the mounter, the individual electronic components, and the board.

7. The manufacturing management system of claim 4, wherein the verification apparatus has a verification apparatus CPU and comprises:

an incorporation information reading unit of the verification apparatus CPU that reads the incorporation information;

a design information reading unit of the verification apparatus CPU that reads, from a design information storage unit that stores design information of the manufacturing object, the design information; and an adjustment unit of the verification apparatus CPU that performs an adjustment by correcting an operation of the manufacturing object based on the read incorporation information and the read design information.

8. The manufacturing management system according to claim 4, wherein the component information further includes characteristics per unit of package in the packaged components, the characteristics per unit of package comprising detailed information containing an error per unit of individual package even if the packages are the same.

\* \* \* \* \*